US009992917B2

(12) United States Patent
Yanke et al.

(10) Patent No.: US 9,992,917 B2
(45) Date of Patent: Jun. 5, 2018

(54) 3-D PRINTING METHOD FOR PRODUCING TUNGSTEN-BASED SHIELDING PARTS

(71) Applicant: Vulcan GMS, Milwaukee, WI (US)

(72) Inventors: Charles H. Yanke, Oconomowoc, WI (US); Robert R. Durkee, III, Austin, TX (US); David W. Douglas, Austin, TX (US)

(73) Assignee: VULCAN GMS, Milwaukee, WI (US)

( * ) Notice: Subject to any disclaimer, the term of this patent is extended or adjusted under 35 U.S.C. 154(b) by 7 days.

(21) Appl. No.: 14/642,162

(22) Filed: Mar. 9, 2015

(65) Prior Publication Data

US 2015/0257313 A1 Sep. 10, 2015

Related U.S. Application Data

(60) Provisional application No. 61/950,514, filed on Mar. 10, 2014.

(51) Int. Cl.
| B29C 41/02 | (2006.01) |
| H05K 9/00 | (2006.01) |
| B33Y 10/00 | (2015.01) |
| B29C 64/165 | (2017.01) |
| B29C 64/118 | (2017.01) |
| B29C 64/112 | (2017.01) |
| B29C 70/88 | (2006.01) |
| B29C 64/106 | (2017.01) |

(Continued)

(52) U.S. Cl.
CPC ......... *H05K 9/0083* (2013.01); *B29C 64/106* (2017.08); *B29C 64/112* (2017.08); *B29C 64/118* (2017.08); *B29C 64/165* (2017.08); *B29C 70/882* (2013.01); *B33Y 10/00* (2014.12); *B29K 2101/12* (2013.01); *B29K 2505/08* (2013.01); *B29K 2995/0011* (2013.01)

(58) Field of Classification Search
CPC ............ B29C 67/0055; B29C 67/0059; B29C 67/0062; B29C 67/0081; B29C 70/882; B29C 64/10; B29C 64/106; B29C 64/112; B29C 64/118; B29C 64/165; B29K 2995/0011
USPC ....................................................... 264/308
See application file for complete search history.

(56) References Cited

U.S. PATENT DOCUMENTS 5,033,849 A 7/1991 Ornter et al.
5,130,342 A 7/1992 McAllister et al.
(Continued)

FOREIGN PATENT DOCUMENTS

EP 2659953 6/2013
EP 2666180 11/2013
(Continued)

OTHER PUBLICATIONS

PCT/US15/19586, International Search Report and Written Opinion dated Jun. 12, 2015, 13 pages.
(Continued)

*Primary Examiner* — Leo B Tentoni
(74) *Attorney, Agent, or Firm* — Boyle Fredrickson, S.C.

(57) ABSTRACT

A method of manufacturing an electromagnetic shield for electromagnetic radiation shielding. The electromagnetic shield is formed via the additive fabrication of a compound comprised of at least 90 percent tungsten by weight or alternatively 40 to 60 percent tungsten by volume.

16 Claims, 2 Drawing Sheets

(51) Int. Cl.
  *B29K 101/12* (2006.01)
  *B29K 505/08* (2006.01)

(56) References Cited

U.S. PATENT DOCUMENTS

| | | | |
|---|---|---|---|
| 5,738,817 | A | 4/1998 | Danforth et al. |
| 6,021,857 | A | 2/2000 | Birk et al. |
| 6,214,474 | B1 | 4/2001 | Barbist et al. |
| 6,397,922 | B1 | 6/2002 | Sachs et al. |
| 6,413,021 | B1 | 7/2002 | Koch et al. |
| 6,443,354 | B1 | 9/2002 | Plochl et al. |
| 6,447,742 | B1 | 9/2002 | Lackner et al. |
| 6,463,763 | B2 | 10/2002 | Walser et al. |
| 6,514,456 | B1 | 2/2003 | Lackner et al. |
| 6,536,305 | B2 | 3/2003 | Huber |
| 6,565,988 | B1 | 5/2003 | Plochl et al. |
| 6,579,044 | B1 | 6/2003 | Trenkwalder et al. |
| 6,629,559 | B2 | 10/2003 | Sachs et al. |
| 6,634,188 | B1 | 10/2003 | Gruber et al. |
| 6,715,386 | B2 | 4/2004 | Maier |
| 6,726,937 | B2 | 4/2004 | Kathrein et al. |
| 6,737,186 | B2 | 5/2004 | Janousek et al. |
| 6,753,650 | B2 | 6/2004 | Leichtfried |
| 6,796,162 | B2 | 9/2004 | Dreer et al. |
| 6,805,759 | B2 | 10/2004 | Hoffmann et al. |
| 6,868,698 | B2 | 3/2005 | Gruber et al. |
| 6,907,661 | B2 | 6/2005 | Rodhammer |
| 6,908,588 | B2 | 6/2005 | Wilhartitz et al. |
| 6,913,790 | B2 | 7/2005 | Schintlmeister et al. |
| 6,914,330 | B2 | 7/2005 | Kneringer et al. |
| 6,998,180 | B2 | 2/2006 | Ludtke et al. |
| 7,128,980 | B2 | 10/2006 | Schedler et al. |
| 7,390,456 | B2 | 6/2008 | Glatz et al. |
| 7,439,676 | B2 | 10/2008 | Walser et al. |
| 7,531,020 | B2 | 5/2009 | Weber |
| 7,670,681 | B2 | 3/2010 | Schedler et al. |
| 7,752,728 | B2 | 7/2010 | Schedler et al. |
| 7,762,448 | B2 | 7/2010 | Rodhammer |
| 7,767,138 | B2 | 8/2010 | Jehanno et al. |
| 7,795,349 | B2 | 9/2010 | Bredt et al. |
| 7,806,995 | B2 | 10/2010 | Jehanno |
| 7,940,880 | B2 | 5/2011 | Schedler |
| 8,163,435 | B2 | 4/2012 | Glatz et al. |
| 8,173,063 | B2 | 5/2012 | Zobl et al. |
| 8,243,884 | B2 | 8/2012 | Rodhammer et al. |
| 8,249,210 | B2 | 8/2012 | Schedler et al. |
| 8,405,629 | B2 | 3/2013 | Reinfried et al. |
| 8,557,383 | B2 | 10/2013 | Schedler et al. |
| 8,575,051 | B2 | 11/2013 | Ludtke |
| 8,580,383 | B2 | 11/2013 | Schedler et al. |
| 8,597,478 | B2 | 12/2013 | Kuniya et al. |
| 8,753,433 | B2 | 6/2014 | Haring et al. |
| 8,753,785 | B2 | 6/2014 | Brandner et al. |
| 2002/0039658 | A1 | 4/2002 | Bunyan et al. |
| 2003/0027005 | A1* | 2/2003 | Elliott .......... B22F 1/0003 428/457 |
| 2004/0239253 | A1 | 12/2004 | Walser et al. |
| 2005/0045358 | A1 | 3/2005 | Arnold |
| 2006/0052249 | A1 | 3/2006 | Schedler et al. |
| 2006/0118984 | A1 | 6/2006 | Farber et al. |
| 2006/0130958 | A1 | 6/2006 | Ludtke |
| 2006/0157884 | A1 | 7/2006 | Ludtke et al. |
| 2006/0169369 | A1 | 8/2006 | Jehanno |
| 2006/0285990 | A1 | 12/2006 | Jehanno et al. |
| 2007/0042895 | A1 | 2/2007 | Weber |
| 2007/0056650 | A1 | 3/2007 | Schedler et al. |
| 2007/0086909 | A1 | 4/2007 | Abenthung et al. |
| 2007/0119907 | A1 | 5/2007 | Rodhammer |
| 2007/0137847 | A1 | 6/2007 | Schedler et al. |
| 2007/0148031 | A1 | 6/2007 | Spielmann et al. |
| 2007/0246517 | A1 | 10/2007 | Schedler et al. |
| 2008/0032530 | A1 | 2/2008 | Friedrich et al. |
| 2008/0100991 | A1 | 5/2008 | Schedler et al. |
| 2009/0042080 | A1 | 2/2009 | Glatz et al. |
| 2009/0096687 | A1 | 4/2009 | Gentilman et al. |
| 2009/0160105 | A1 | 6/2009 | Jaeckel et al. |
| 2009/0175400 | A1 | 7/2009 | Schedler et al. |
| 2010/0011910 | A1 | 1/2010 | Schedier et al. |
| 2010/0047565 | A1 | 2/2010 | Kailer et al. |
| 2010/0057199 | A1 | 3/2010 | Guggenbichler et al. |
| 2010/0233576 | A1 | 9/2010 | Brandner et al. |
| 2010/0269907 | A1 | 10/2010 | Lackner et al. |
| 2010/0316193 | A1 | 12/2010 | Rodhammer et al. |
| 2011/0143261 | A1 | 6/2011 | Brandner et al. |
| 2011/0199341 | A1 | 8/2011 | Reinfried et al. |
| 2012/0073958 | A1 | 3/2012 | Abenthung et al. |
| 2012/0073959 | A1 | 3/2012 | Abenthung et al. |
| 2012/0097356 | A1 | 4/2012 | Kuniya et al. |
| 2012/0135336 | A1 | 5/2012 | Waeschke et al. |
| 2012/0163549 | A1 | 6/2012 | Hove et al. |
| 2012/0171464 | A1 | 7/2012 | Kailer et al. |
| 2012/0189484 | A1 | 7/2012 | Zobl et al. |
| 2013/0140159 | A1 | 6/2013 | Kowanda et al. |
| 2013/0199929 | A1 | 8/2013 | Polcik et al. |
| 2013/0206995 | A1 | 8/2013 | Bhaskar et al. |
| 2013/0233705 | A1 | 9/2013 | O'Sullivan |
| 2013/0235981 | A1 | 9/2013 | Handtrack et al. |
| 2013/0308758 | A1 | 11/2013 | Eiter et al. |
| 2014/0023957 | A1 | 1/2014 | Brandner et al. |
| 2014/0027276 | A1 | 1/2014 | Linke et al. |
| 2014/0041589 | A1 | 2/2014 | Martinz et al. |
| 2014/0042147 | A1 | 2/2014 | Plankensteiner et al. |
| 2014/0147692 | A1 | 5/2014 | Brandner et al. |
| 2014/0035995 | A1 | 6/2014 | Chou et al. |
| 2015/0048209 | A1* | 2/2015 | Hoyt .......... B33Y 80/00 264/308 X |

FOREIGN PATENT DOCUMENTS

| | | |
|---|---|---|
| EP | 2676318 | 12/2013 |
| EP | 2694697 | 2/2014 |
| EP | 2734323 | 5/2014 |
| EP | 2740142 | 6/2014 |
| WO | 2013179135 | 5/2013 |
| WO | 2013155540 | 10/2013 |
| WO | 2014063176 | 1/2014 |
| WO | 2014023413 | 2/2014 |
| WO | 2014023414 | 2/2014 |
| WO | 2014040100 | 3/2014 |
| WO | 2014032789 | 6/2014 |

OTHER PUBLICATIONS

EP15761209.4, European Search Report dated Oct. 25, 2017, 8 pages.

* cited by examiner

3-D PRINTING METHOD FOR PRODUCING TUNGSTEN-BASED SHIELDING PARTS

CROSS-REFERENCE TO RELATED APPLICATIONS

This application claims priority to U.S. provisional patent application Ser. No. 61/950,514, filed Mar. 10, 2014, the entire contents of which is incorporated herein by reference.

BACKGROUND OF THE INVENTION

1. Technical Field

The present disclosure generally relates to a method of manufacturing a tungsten-based electromagnetic shielding part and more particularly to a method of manufacturing a tungsten-based electromagnetic shielding part via additive fabrication, which may selectively include one or more additional shielding materials mixed with tungsten.

2. Background Art

Various types of electromagnetic radiation shielding have been developed for use in imaging applications and similar applications, such as x-ray fluorescence (XRF) devices, that also require electromagnetic radiation shielding. Traditionally such forms of shielding include the usage of lead. Lead is an effective shielding material due to its high density, i.e., relatively high atomic mass and small atomic radius, which absorbs and scatters various forms of electromagnetic radiation including x-rays. With recent improvements in the field of digital radiography, the digital sensors used to replace traditional photographic film are capable of producing x-ray images from a lower level of radiation emission. However, lead lacks structural strength and rigidity such that its shape may warp or shift over time, and may result in shielding failure.

Recent improvements have been made to reinforce traditional sheets of lead shielding with additional substrates to provide structural strength. For example lead shielding may be adhesively bonded to an aluminum substrate in order to provide the structural or mechanical rigidity required for use in medical imaging devices. However, traditional shielding in which lead and an aluminum substrate are adhesively bound together has been known to exhibit shortcomings such as delaminating or undesirable moving or creeping over a prolonged period of time. Additionally, the lamination manufacturing process imposes limitations on the possible size and shape of the shielding that can be made according to traditional methods. Accordingly, there is currently a need for an improved electromagnetic shielding that provides improved functionality and its method of manufacturing The present invention seeks to improve upon the prior art by providing a method of manufacturing a tungsten based electromagnetic shielding element by means of additive fabrication, or specifically three dimensional printing, and a electromagnetic shielding element produced according to that method of manufacturing.

SUMMARY OF THE INVENTION

It is therefore an object of the present invention to provide a method of additively fabricating an electromagnetic shielding element comprising the steps of:
receiving data defining one or more parameters of an electromagnetic shield;
generating a digital model of the electromagnetic shield from the one or more parameters;
defining an additive fabrication tool pathway for forming the electromagnetic shield according to the model;
providing a quantity of a molten compound comprising an electromagnetic shielding component to an additive fabrication tool;
dispensing from the additive fabrication tool, the molten compound into a predetermined location according to the tool pathway, wherein the predetermined location defines the shape of the electromagnetic shielding element; and
cooling the molten compound to form a hardened compound comprising the electromagnetic shielding element.

It is another object of the present invention to provide a method of additive fabrication to form an electromagnetic shielding element having approximately 90 to 98 percent tungsten by weight.

It is still another object of the present invention to provide a method of additive fabrication to form an electromagnetic shielding element of approximately 40 to 60 percent tungsten by volume.

It is yet another object of the present invention to provide a method of three dimensional printing to form an electromagnetic shielding element having approximately 96 percent tungsten by weight suspended in a polymeric matrix.

It is yet another object of the present invention to provide a method of three dimensional printing to form an electromagnetic shielding element having approximately 90 to 98 percent by weight of one or more heavy metals or metalloids selected from a group including but not limited to tungsten, tantalum, molybdenum, bismuth, iron, steel, stainless steel, copper, brass, bronze, zinc, aluminum, beryllium, manganese, barium sulfate, and arsenic suspended in a polymeric matrix.

In another embodiment of the invention, the step of dispensing the molten compound into a predetermined location may comprise depositing multiple layers of molten compound into the predetermined location.

Further aspects or embodiments of the present invention will become apparent from the ensuing description which is given by way of example only.

DETAILED DESCRIPTION OF THE DRAWINGS

Figure 1:
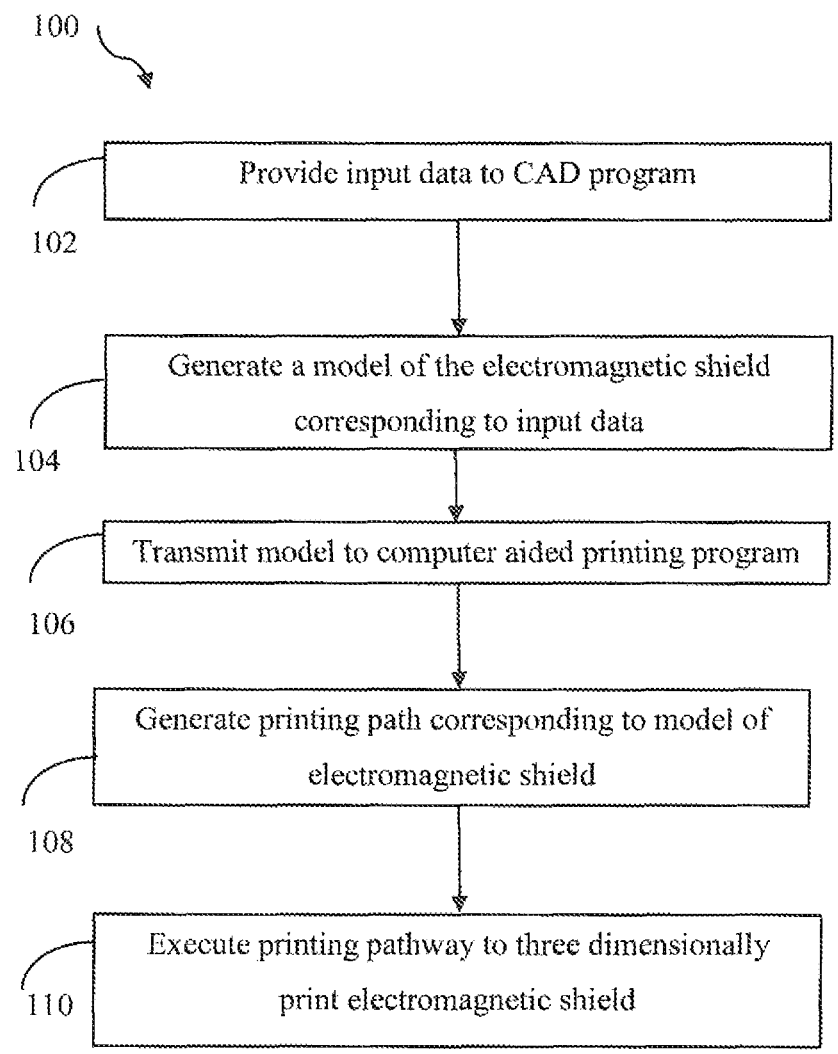
FIG. 1 is flow chart showing the steps of a method of manufacturing an electromagnetic shield according to one embodiment of the present invention.

Referring now to FIG. 1, there is shown one embodiment of a method 100 of manufacturing an electromagnetic shield 200 according to the present invention. The method 100 as shown is a method of three dimensionally printing, i.e., additively fabricating the electromagnetic shield 200. As described herein, the present invention discloses a fused deposited modelling or fused filament method of additive fabrication, however, any other form of additive fabrication or three dimensional printing may also be considered within the scope of this invention.

The method 100 as shown begins with the user providing input data into a computer aided design ("CAD") program in block 102. The user provided input data defines the physical parameters of the electromagnetic shield 200 as specified by the user. Such parameters may include, but are not limited to the size, shape, density, and material composition of the electromagnetic shield 200. At subsequent block 104 the CAD program then proceeds to generate a digital model corresponding to the desired electromagnetic shield 200, based on the data input at block 102. In one embodiment, the digital model may be newly generated for each electromagnetic shield 200; and in an alternative embodiment, a model corresponding to the user input data may be selected from a preformed library of user selectable models.

Once generated by the CAD program, the digital model data is subsequently transmitted to a computer aided printing program associated with a three dimensional printing machine, at block 106. The computer aided printing program may be located on either the same or a discrete computer as the CAD program and/or the program used for user input of the parametric data. At block 108, the computer aided printing program generates a series of printing movement instructions, i.e., a printing path, necessary to form the electromagnetic shield 200 corresponding to the digital model that was generated by the CAD program at block 104.

The three dimensional printer then proceeds to execute the printing path at block 110. Executing the printing path at block 110 includes heating a compound and then extruding the resultant molten compound in the form of the electromagnetic shield 200 corresponding to the user input data initially provided in block 102. The compound then cools and hardens into the desired the electromagnetic shield 200 exhibiting the variables including, but not limited to size, shape, density, and material composition, as initially specified in block 102.

Figure 2:
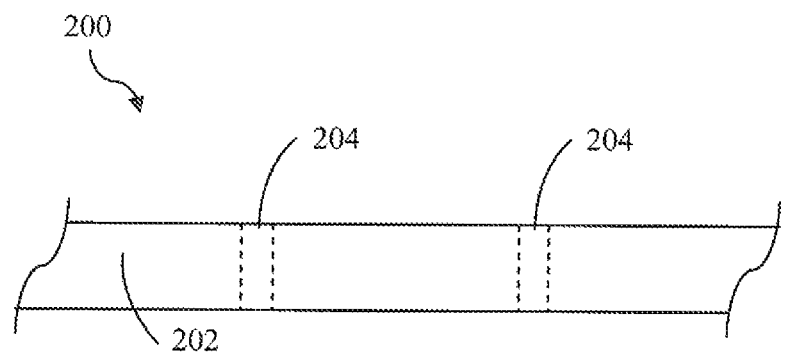
FIG. 2 is cross sectional front side view of a single layer electromagnetic shield manufactured according to one embodiment of the present invention.

Referring now to FIG. 2, in one embodiment, executing the printing path at block 110 may include extruding a single layer 202 of molten compound to create an electromagnetic shield 200 having a minimal thickness, as specified in the user input data initially provided in block 102. Additionally, executing the printing path at block 110 may include forming voids or apertures 204 in the electromagnetic shield 200 to facilitate the passage of mounting fasteners or other objects through the shielding element.

Figure 3:
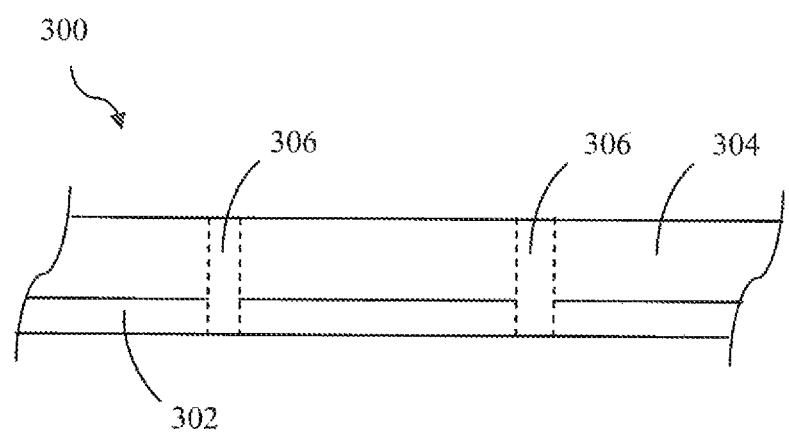
FIG. 3 is cross sectional front side view of a multi-layer electromagnetic shield manufactured according to one embodiment of the present invention.

Alternatively, as shown in FIG. 3, executing the printing path at block 110 may include extruding multiple layers of molten compound, e.g., a first layer 304 and a second layer 306, to create an electromagnetic shield 300 having a relatively greater thickness, which may similarly be specified in the user input data initially provided in block 102. Alternatively, as will be described in further detail below, one of the layers, e.g., the first layer 302, may be a preformed substrate on which the second layer 304 is deposited.

As was previously described, electromagnetic shield 300 may also include forming voids or apertures 306 in the multiple layers 302, 304 of the electromagnetic shield 300 to facilitate the passage of mounting fasteners or other objects through the shielding element. It is also considered within the scope of the present invention that executing the printing path at block 110 may include extruding differing layers or volumes of molten compound at discrete locations as to create an electromagnetic shield 200 of variable thickness.

In one embodiment, the three dimensional printer operates in accordance with a fused deposition modelling ("FDM") method of three dimensional printing, in which a filament having a diameter of approximately between 1.75 and 3.00 millimeters, inclusive, is provided to the three dimensional printer, which after heating or melting the filament, extrudes an output thread having a diameter of between 0.30 and 0.60 millimeters, and preferably a diameter of approximately 0.40 millimeters. Providing a three dimensional printer having a nozzle configured to output a thread having a diameter of between 0.30 and 0.60 millimeters, and preferably a diameter of approximately 0.40 millimeters provides for the resultant electromagnetic shielding element 200 to exhibit sufficient surface area and structural details while minimizing nozzle clogging due to electromagnetic shielding component particles such as tungsten and other heavy metals or metalloids discussed in detail below. Accordingly, during the execution of the printing path at block 110, the resultant electromagnetic shield 200 may have a thickness as small as a single output thread layer, i.e., approximately between 0.30 and 0.60 millimeters, inclusive. However, various diameters of supplied filaments and output threads are considered well within the scope of this invention When executing the printing path at block 110 the nozzle of the three dimensional printer may travel in three dimensions, along X, Y and Z axes as the electromagnetic shield 200 is formed in accordance with the series of printing movement instructions generated at block 108. Alternatively, the nozzle may be fixed and deposit molten compound onto a travelling stage that travels in three dimensions, along X, Y and Z axes, also in accordance with the series of printing movement instructions generated at block 108. In still another alternative, either the nozzle or stage may travel two dimensionally along X and Y axes, i.e., in a fixed plane while the corresponding nozzle or stage travels along the Z axis, perpendicular to the Z and Y axis plane.

In one embodiment of the present invention, the compound is a material configured for electromagnetic shielding, such as a compound having approximately 80 to 98, preferably 90 to 98, and more preferably 96 percent by weight of tungsten. Providing a compound having approximately 80 to 98, preferably 90 to 98, and more and preferably 96 percent by weight of tungsten results in the formation of an electromagnetic shield that exhibits a high tungsten density; particularly relative to traditional three dimensional printed components. As a result of the high density of the tungsten particles, the electromagnetic shield element produced in accordance with the method of the present invention exhibits electromagnetic shielding properties equivalent to a comparable shield formed of lead. Alternatively, the compound may be a material having approximately 40 to 60 percent tungsten by volume, and preferably 54 percent by volume of tungsten. In these embodiments of the present invention, the tungsten may be suspended in a polymeric matrix, such as but not limited to acrylonitrile butadiene styrene, polyamide, polyester, co-polyester, polyurethane, polylactic acid, or any comparably thermoplastic polymeric material. The resultant electromagnetic radiation shield 200, may exhibit 100 percent lead equivalent radiation shielding properties. Alternatively, if desirable, the electromagnetic radiation shield 200, may exhibit less than 100 percent lead equivalent radiation shielding properties by means of altering the components of the compound described above. Furthermore, the present invention also includes the use of alternative electromagnetic shielding components, such as lead, suspended in polymeric matrix, and/or a combination of multiple discrete electromagnetic shielding components such as but not limited to both tungsten and lead.

In one embodiment of the present invention, the tungsten or an alternative electromagnetic shielding component of the compound, such as one or more heavy metals or metalloids selected from the group including but not limited to tungsten, tantalum, molybdenum, bismuth, iron, steel, stainless steel, copper, brass, bronze, zinc, aluminum, beryllium, manganese, barium sulfate, and arsenic, is a powder, preferably comprised of individual particles having a diameter of approximately between 2.0 to 100.0 microns, and preferably a diameter of approximately 20.0 microns.

The tungsten and polymeric matrix compound employed in the method of the present invention may be supplied to the nozzle of the three dimensional printer in a solid state filament, wherein preferably the tungsten particles are evenly distributed throughout the polymeric matrix. Alternatively, the polymeric material and the tungsten or other electromagnetic shielding components of the compound may be provided to the three dimensional printer independently, and combined together prior to extrusion at block 110. After the compound has been extruded from the three dimensional printer, via execution of the printing path at block 110, it is preferable that the tungsten particles remain approximately evenly distributed throughout the polymeric medium of the resultant electromagnetic shield 200.

In yet another embodiment of the method of the present invention, the electromagnetic shield 300 may be a multi-layer shield that includes a first shield layer 302 and a second shield layer 304. The first shield layer 302 is preferably manufactured via a three dimensionally printed method, i.e., additive fabrication, consistent with the method 100 described above. That is to say that the first shield layer 302 is preferably formed by a fused deposited modeling or fused filament method of additive fabrication of a material configured for electromagnetic shielding, such as a compound having approximately 90 to 98, and preferably 96 percent by weight of tungsten. The second shield layer 304 may be a blank or plate of material. Preferably the second shield layer 304 would be blank or plate of material such as lead or other material that provides an electromagnetic shielding sufficient for absorbing and/or scattering electromagnetic radiation, and namely x-ray radiation. Alternatively or in addition to the lead plate, the second shield layer 304 may be a blank or plate of material such as aluminum or plastic that provides increased structural strength to the first shield layer 302. The first and second shield layers 302, 304 may be mechanically fastened together, adhesively affixed together, or otherwise affixed. Alternatively, the first shield layer 302 may be three dimensionally printed directly onto the second shield layer 304, in accordance with the method described above.

In one embodiment of multilayer electromagnetic shield 300, the first shield layer 302 is configured to exhibit higher radiation shielding properties relative to the second shield layer 204. In such an embodiment, the first shield layer 302 is configured to be positioned nearest the electromagnetic radiation source and the second shield layer 304 is configured to be positioned further from the electromagnetic radiation source.

It should be understood that the invention is not limited in its application to the details of construction and arrangements of the components set forth herein. The invention is capable of other embodiments and of being practiced or carried out in various ways by those skilled in the art. Variations and modifications of the foregoing are within the scope of the present invention. It is also understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

We claim:

1. A method of manufacturing an electromagnetic shielding element, comprising the steps of:
   receiving data defining one or more parameters of an electromagnetic shielding element;
   generating a digital model of the electromagnetic shielding element from the one or more parameters;
   defining an additive fabrication tool pathway for forming the electromagnetic shielding element according to the digital model;
   providing to an additive fabrication tool a molten compound consisting of a substantially pure volume of tungsten substantially evenly distributed throughout a polymeric matrix in a molten state, wherein the molten compound comprises at least 90 percent tungsten by weight and equal to or less than 60 percent tungsten by volume;
   dispensing from the additive fabrication tool, the molten compound into a predetermined location according to the tool pathway, wherein the predetermined location defines the shape of the electromagnetic shielding element; and
   cooling the molten compound to form a hardened compound comprising the volume of tungsten substantially evenly distributed throughout a single uninterrupted layer of the polymeric matrix in a hardened state to define the electromagnetic shielding element, wherein the electromagnetic shielding element has a density substantially equivalent to lead and exhibits an x-ray radiation attenuation property substantially equivalent to lead.

2. The method of claim 1, wherein the molten compound is substantially devoid of a non-tungsten electromagnetic shielding component.

3. The method of claim 1, wherein the tungsten is comprised of tungsten particles, said particles having a diameter of greater than 2.0 and less than 100.0 microns.

4. The method of claim 2, wherein the molten compound comprises 40 to 60 percent tungsten by volume.

5. The method of claim 1, wherein the polymeric matrix is a thermoplastic polymeric material.

6. The method of claim 1, wherein the polymeric matrix is selected from a group including acrylonitrile butadiene styrene, polyamide, polyester, co-polyester, polyurethane, and polylactic acid.

7. The method of 1, wherein the molten compound is dispensed from the additive fabrication tool in a thread having a diameter of between 0.30 and 0.60 millimeters.

8. The method of claim 1, wherein the molten compound is dispensed from the additive fabrication tool onto a substrate, and wherein the substrate comprises a layer of the electromagnetic shielding element.

9. The method of claim 8, wherein the substrate is an electromagnetic radiation shield.

10. A method of additively fabricating an electromagnetic shielding element comprising the steps of:
    providing data defining one or more parameters of an electromagnetic shielding element to a computer aided design program;
    generating as digital model of the electromagnetic shielding element from the one or more parameters;
    transmitting the digital model of the electromagnetic shielding element to a computer aided printing program;

generating a three dimensional printing pathway for forming the electromagnetic shielding element according to the digital model;

transmitting the three dimensional printing pathway to the three dimensional printing tool;

providing to the three dimensional printing tool a quantity of a compound consisting of a substantially pure volume of tungsten substantially evenly distributed throughout a polymeric matrix, wherein the compound comprises at least 90 percent tungsten by weight and equal to or less than 60 percent tungsten by volume;

dispensing from the three dimensional printing tool, the compound into a predetermined location according to the printing pathway, wherein the predetermined location defines the shape of the electromagnetic shielding element; and curing the compound to form a hardened compound comprising the volume of tungsten substantially evenly distributed throughout a single uninterrupted layer of the polymeric matrix in a hardened state to define the electromagnetic shielding element, wherein the electromagnetic shielding element has a density substantially equivalent to lead and exhibits and x-ray radiation attenuation property substantially equivalent to lead.

11. The method of claim 10, wherein the compound is a molten compound.

12. The method of claim 10, wherein the tungsten is comprised of tungsten particles, said particles having a diameter of greater than 2.0 and less than 100.0 microns.

13. The method of claim 11, wherein the polymeric matrix of the molten compound is a thermoplastic polymeric material.

14. The method of claim 11, wherein the polymeric matrix of the molten compound is selected from a group including acrylonitrile butadiene styrene; polyamide, polyester, co-polyester, polyurethane, and polylactic acid.

15. The method of claim 11, wherein the molten compound is dispensed from the three dimensional printing tool in a thread having a diameter of between 0.30 and 0.60 millimeters.

16. The method of claim 13, wherein the molten compound is dispensed from the three dimensional printing tool onto a substrate, and wherein the substrate comprises a layer of the resultant electromagnetic shielding element.

* * * * *